(12) United States Patent
Straka et al.

(10) Patent No.: US 7,985,103 B2
(45) Date of Patent: *Jul. 26, 2011

(54) COMMUNICATION CONNECTOR WITH IMPROVED CROSSTALK COMMUNICATION

(75) Inventors: Frank M. Straka, Chicago, IL (US); Ronald L. Tellas, Schererville, IN (US)

(73) Assignee: Panduit Corp., Tinley Park, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/963,090

(22) Filed: Dec. 8, 2010

(65) Prior Publication Data
US 2011/0104933 A1 May 5, 2011

Related U.S. Application Data

(63) Continuation of application No. 12/611,178, filed on Nov. 3, 2009, now Pat. No. 7,850,492.

(51) Int. Cl.
*H01R 24/00* (2006.01)
(52) U.S. Cl. .................. 439/676; 439/941
(58) Field of Classification Search .......... 439/676, 439/941, 620.11, 620.17, 620.23
See application file for complete search history.

(56) References Cited

U.S. PATENT DOCUMENTS

| | | | | |
|---|---|---|---|---|
| 5,186,647 A * | 2/1993 | Denkmann et al. | ........... | 439/395 |
| 5,299,956 A * | 4/1994 | Brownell et al. | ........... | 439/638 |
| 5,326,284 A * | 7/1994 | Bohbot et al. | ........... | 439/676 |
| 5,362,254 A * | 11/1994 | Siemon et al. | ........... | 439/536 |
| 5,454,738 A * | 10/1995 | Lim et al. | ........... | 439/676 |
| 5,470,244 A * | 11/1995 | Lim et al. | ........... | 439/189 |
| 5,513,065 A * | 4/1996 | Caveney et al. | ........... | 361/311 |
| 5,618,185 A * | 4/1997 | Aekins | ........... | 439/76.1 |
| 5,700,167 A * | 12/1997 | Pharney et al. | ........... | 439/676 |
| 5,797,764 A * | 8/1998 | Coulombe et al. | ........... | 439/55 |
| 5,911,602 A * | 6/1999 | Vaden | ........... | 439/676 |
| 5,940,959 A * | 8/1999 | Caveney et al. | ........... | 29/620 |
| 5,967,853 A * | 10/1999 | Hashim | ........... | 439/676 |
| 5,997,358 A * | 12/1999 | Adriaenssens et al. | ........... | 439/676 |
| 6,017,247 A * | 1/2000 | Gwiazdowski | ........... | 439/676 |
| 6,089,923 A * | 7/2000 | Phommachanh | ........... | 439/676 |
| 6,106,335 A * | 8/2000 | Merchant et al. | ........... | 439/620.23 |

(Continued)

FOREIGN PATENT DOCUMENTS

EP 1414115 A1 4/2004

(Continued)

*Primary Examiner* — T C Patel
*Assistant Examiner* — Phuong T Nguyen
(74) *Attorney, Agent, or Firm* — Robert A. McCann; Zachary J. Smolinski; Christopher S. Clancy

(57) ABSTRACT

A communication jack has a housing with a face having a plug receiving aperture. A plurality of conductive path pairs extends from corresponding plug interface contacts located at the plug receiving aperture to corresponding output terminals. A first circuit board is connected to the plug interface contacts and a second circuit board is connected to the plug interface contacts and the output terminals. The first circuit board has a first single stage of crosstalk compensation with opposite polarity of the crosstalk of a plug for a first combination of the conductive path pairs. The second circuit board includes a second single stage of opposite polarity crosstalk compensation for some of the conductive path pairs not compensated on the first circuit board. The stages cancel substantially all of the crosstalk caused by the plug, for the signal operating frequencies, for corresponding combinations of the conductive path pairs.

13 Claims, 10 Drawing Sheets

U.S. PATENT DOCUMENTS

| | | | |
|---|---|---|---|
| 6,120,330 A * | 9/2000 | Gwiazdowski | 439/676 |
| 6,165,023 A | 12/2000 | Troutman et al. | |
| 6,176,742 B1 * | 1/2001 | Arnett et al. | 439/620.23 |
| 6,186,834 B1 * | 2/2001 | Arnett et al. | 439/676 |
| 6,196,880 B1 * | 3/2001 | Goodrich et al. | 439/676 |
| 6,231,397 B1 * | 5/2001 | de la Borbolla et al. | 439/676 |
| 6,305,950 B1 * | 10/2001 | Doorhy | 439/76.1 |
| 6,319,069 B1 * | 11/2001 | Gwiazdowski | 439/676 |
| 6,350,158 B1 * | 2/2002 | Arnett et al. | 439/676 |
| 6,402,560 B1 * | 6/2002 | Lin | 439/676 |
| 6,464,541 B1 | 10/2002 | Hashim et al. | |
| 6,533,618 B1 | 3/2003 | Aekins | |
| 2009/0104821 A1 | 4/2009 | Marti et al. | |
| 2009/0163084 A1 | 6/2009 | Straka et al. | |

FOREIGN PATENT DOCUMENTS

| | | |
|---|---|---|
| EP | 1826879 A1 | 8/2007 |
| WO | 2006062794 A1 | 6/2006 |
| WO | 2009102851 A1 | 8/2009 |

* cited by examiner

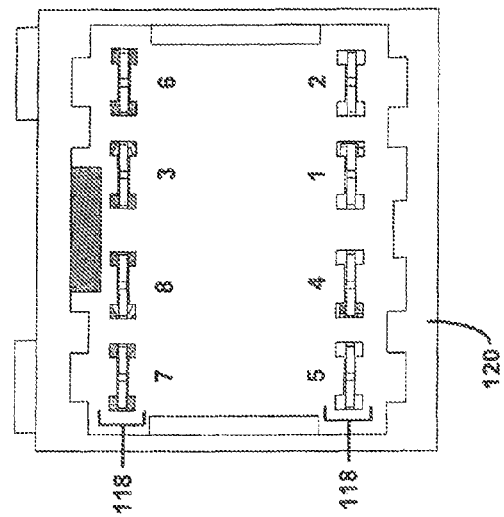
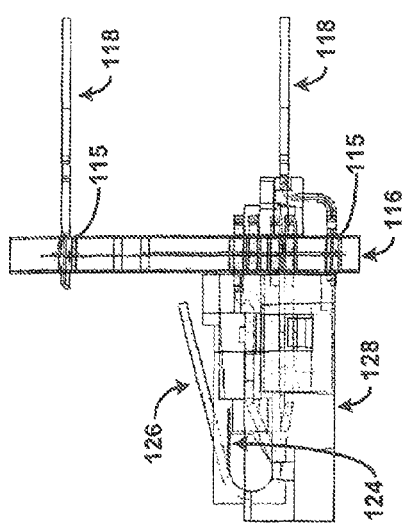
FIG. 6
FIG. 4
FIG. 5

COMMUNICATION CONNECTOR WITH IMPROVED CROSSTALK COMMUNICATION

CROSS-REFERENCE TO RELATED APPLICATIONS

This application is a continuation of U.S. application Ser. No. 12/611,178, filed Nov. 3, 2009, which issued as U.S. Pat. No. 7,850,492 on Dec. 14, 2010, the subject matter of which is hereby incorporated by reference in its entirety.

FIELD OF THE INVENTION

The present invention relates generally to crosstalk compensation, and more particularly, to crosstalk compensation in a communication jack.

BACKGROUND OF THE INVENTION

In an electrical communication system, it is sometimes advantageous to transmit data in the form of differential signals over a pair of conductive paths (i.e., a conductive path pair) rather than a single conductive path, where the transmitted signal comprises the voltage difference between the conductive paths without regard to the absolute voltages present. Each conductive path in a conductive path pair is capable of picking up electrical noise from outside sources, e.g., neighboring data lines, or other sources. Differential signals may be advantageous to use due to the fact the signals are less susceptible to these outside sources.

A concern with differential signals is electrical noise that is caused by neighboring differential conductive path pairs, where the individual conductors on each conductive path pair couple (inductively or capacitively) in an unequal manner that results in added noise to the neighboring conductive path pair. This is referred to as crosstalk. Crosstalk can occur on a near-end (NEXT) and a far-end (FEXT) of a transmission line between differential conductive path pairs within a channel (referred to as internal NEXT and internal FEXT) or can couple to differential conductive path pairs in a neighboring channel (referred to as alien NEXT and alien FEXT). Generally speaking, so long as the same noise signal is added to each conductive path in the conductive path pair, then the voltage difference between the conductive paths will remain about the same and crosstalk is minimized.

In the communications industry, as data transmission rates have steadily increased, crosstalk due to capacitive and inductive couplings among the closely spaced parallel conductors within the plug and/or jack has become increasingly problematic. Modular connectors with improved crosstalk performance have been designed to meet the increasingly demanding standards. For example, recent connectors have introduced predetermined amounts of crosstalk compensation to cancel offending NEXT, which, in turn, gives the system an increased bandwidth. This crosstalk compensation is typically implemented in two or more stages for certain conductive path pair combinations, to account for phase differences between couplings in the plug and the jack. These two or more stages have been generally necessary because the source of the crosstalk is at the plug, which is at an increasing electrical distance (phase difference) from the source of the compensation (at the jack) with increasing frequency. With two stages, the phase and polarity differences between each stage are chosen such that they provide cancellation of the crosstalk and typically increase the NEXT bandwidth of the system. However, the two stage compensation scheme requires twice as many capacitors as would be minimally necessary in order to cancel the offending crosstalk from the plug. The addition of these extra capacitors may degrade return loss and create issues in production where minor manufacturing variations in the capacitors lead to jack failures. Thus, there is a continuing need to design new and improved compensation methods and devices.

SUMMARY OF THE INVENTION

The invention comprises, in one form thereof, a communication jack for compensating a source of crosstalk in a mated communication plug over a range of signal operating frequencies, where the jack includes a housing with a first face having a plug receiving aperture therein. A plurality of conductive path pairs extends from corresponding plug interface contacts located at the plug receiving aperture to corresponding output terminals. The plurality of conductive path pairs includes a first circuit board connected to the plug interface contacts and a second circuit board connected to the plug interface contacts and the output terminals. The first circuit board has a first single stage of crosstalk compensation with opposite polarity of the crosstalk of the plug for at least a first combination of the conductive path pairs. The second circuit board includes a second single stage of crosstalk compensation with opposite polarity of the crosstalk of the plug for at least some of the conductive path pairs not compensated on the first circuit board. The stages cancel substantially all of the crosstalk caused by the plug, for all of the signal operating frequencies, for corresponding combinations of the plurality of conductive path pairs.

The invention comprises, in another form thereof, a communication system for connection to at least one communication plug over a range of signal operating frequencies, the communication plug having a source of crosstalk, where the communication system includes electrical equipment having at least one jack receiving aperture. A communication jack is connected to the electrical equipment at the jack receiving aperture. The jack includes a housing with a first face having a plug receiving aperture therein. A plurality of conductive path pairs extends from corresponding plug interface contacts located at the plug receiving aperture to corresponding output terminals. The plurality of conductive path pairs includes a first circuit board connected to the plug interface contacts and a second circuit board connected to the plug interface contacts and the output terminals. The first circuit board has a first single stage of crosstalk compensation with opposite polarity of the crosstalk of the plug for at least a first combination of the conductive path pairs. The second circuit board includes a second single stage of crosstalk compensation with opposite polarity of the crosstalk of the plug for at least some of the conductive path pairs not compensated on the first circuit board. The stages cancel substantially all of the crosstalk caused by the plug, for all of the signal operating frequencies, for corresponding combinations of the plurality of conductive path pairs.

The invention comprises, in yet another form thereof, a method of compensation in a communication jack with a plurality of conductive path pairs including plug interface contacts for making contact with a mating plug. The method of compensation is for compensating for a source of crosstalk in the plug. The method includes the steps of providing a circuit board in direct contact with the plug interface contacts and located at the plug interface contacts beyond where the plug makes electrical contact with the plug interface contacts; and compensating at the circuit board for substantially all of the crosstalk of the plug for at least one combination of the conductive path pairs.

The invention comprises, in yet another form thereof, a communication jack for compensating for a source of near-end crosstalk in a mated communication plug over a range of signal operating frequencies, where the mated plug includes a plurality of plug contacts. The jack includes a housing with a first face having a plug receiving aperture therein. A plurality of conductive path pairs extend from corresponding plug interface contacts located at the plug receiving aperture to corresponding output terminals. The plurality of conductive path pairs includes a circuit board connected to the plug interface contacts beyond where the plug contacts engage the plug interface contacts. The circuit board has a single stage of crosstalk compensation with opposite polarity of the crosstalk of the plug for at least one combination of the conductive path pairs. The single stage of crosstalk compensation cancels substantially all of the near-end crosstalk caused by the plug, for all of the operating frequencies, for at least one combination of the conductive path pairs. The plug interface contacts include a plug contact point approximately where the plug contacts engage the plug interface contacts. The single stage of crosstalk compensation is located a physical distance from the plug contact point, and along the plurality of conductive path pairs, equivalent to a maximum of 3.0 degrees of electrical phase of the signal at the highest intended signal operating frequencies.

An advantage of at least one embodiment of the present invention is a compensation technology with a minimal amount of compensation capacitors.

Another advantage of at least one embodiment of the present invention is improved production efficiency/reliability of the communication jack.

Yet another advantage of at least one embodiment of the present invention is improved return loss in the communication jack.

Yet another advantage of at least one embodiment of the present invention is improved communication channel performance due at least in part to improved return loss in the communication jack.

BRIEF DESCRIPTION OF THE DRAWINGS

The above-mentioned and other features and advantages of this invention, and the manner of attaining them, will become more apparent and the invention will be better understood by reference to the following description of an embodiment of the invention taken in conjunction with the accompanying drawings, wherein:

FIG. 4 is a fragmentary side view of the exemplary communication jack without a mated communication plug;

FIG. 5 is a fragmentary side view of the exemplary communication jack with a mated communication plug;

FIG. 6 is a rear view of the exemplary communication jack with the wire cap removed;

Corresponding reference characters indicate corresponding parts throughout the several views. The exemplification set out herein illustrates one preferred embodiment of the invention, in one form, and such exemplification is not to be construed as limiting the scope of the invention in any manner.

DETAILED DESCRIPTION

Figure 1:
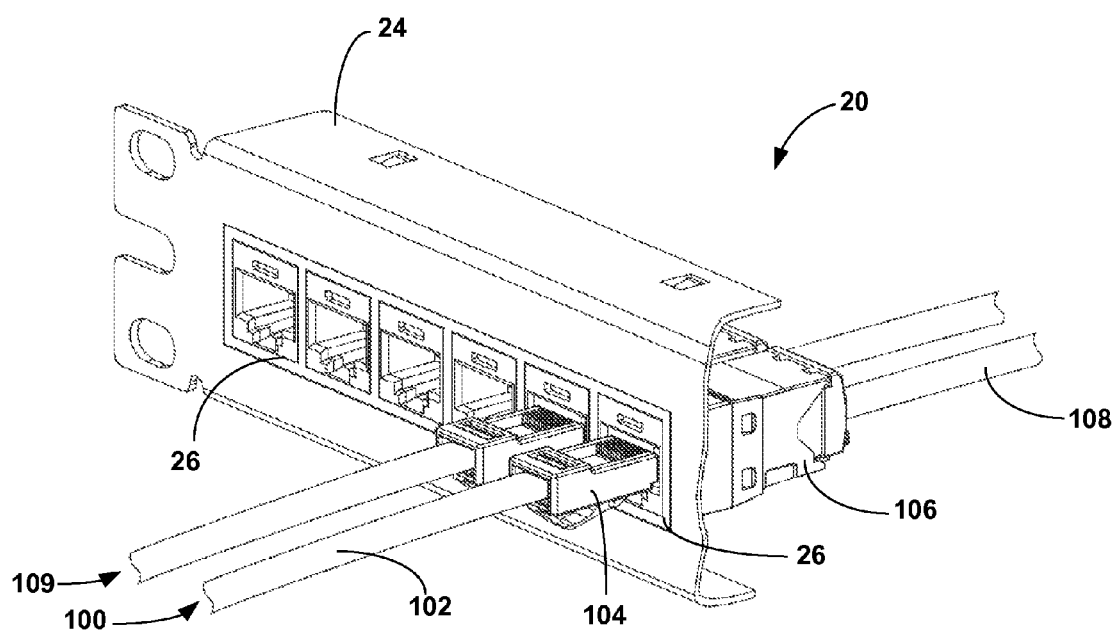
FIG. 1 illustrates a portion of a transmission channel used to transmit data in the form of electrical signals.

Referring to the drawings, and more importantly to FIG. 1, there is shown an electrical system 20 which includes a portion of a transmission channel 100 used to transmit data in the form of electrical signals. As shown from left to right, the portion of channel 100 may include a first cable 102, a communication plug 104, a communication jack 106, and a second cable 108, with the first cable 102 terminated to the communication plug 104 and the second cable 108 terminated to the communication jack 106. When the communication plug 104 and the communication jack 106 are mated, data may be transmitted between the first cable 102 (and any devices connected thereto) and the second cable 108 (and any devices connected thereto) via the mated plug 104/jack 106 (i.e., the connectors). In one example, the first cable 102 and communication plug 104 may be part of a patch cable that connects a computing device (e.g., a personnel computer) to the communication jack 106, and the second cable 108 may be a horizontal cable that connects the communication jack 106 to a telecommunication room, which houses computer networking equipment (e.g., a switch). Other examples are possible as well. Additionally, communication system 20 can include one or more additional channels 109, which may be in close proximity to the other channels in communication system 20.

Communication system 20 can also include equipment 24, with at least one jack receiving aperture 26, illustrated as a patch panel in FIG. 1 but the equipment can be passive equipment or active equipment. Examples of passive equipment can be, but are not limited to, modular patch panels, punchdown patch panels, coupler patch panels, wall jacks, etc. Examples of active equipment can be, but are not limited to, Ethernet switches, routers, servers, physical layer management systems, and power-over-Ethernet equipment as can be found in data centers/telecommunications rooms; security devices (cameras and other sensors, etc.) and door access equipment; and telephones, computers, fax machines, printers and other peripherals as can be found in workstation areas. Communication system 20 can further include cabinets, racks, cable management and overhead routing systems, and other such equipment.

Although jack 106 is illustrated as an unshielded modular jack, jack 106 can alternatively be a punchdown, shielded, or other type of jack, or a combination thereof.

The transmission channel 100 typically includes at least four conductive paths that run across the first cable 102, the mated plug 104/jack 106, and the second cable 108. These conductive paths may be arranged in pairs, such that data may be transmitted over the conductive paths in the form of differential signals. As such, the transmission channel 100, and thus each connector and cable therein, may include at least four conductive paths arranged into two pairs. In a preferred example, the transmission channel 100 will include eight conductive paths arranged into four pairs: conductive paths 4 and 5 (i.e., pair 45), conductive paths 3 and 6 (i.e., pair 36), conductive paths 1 and 2 (i.e., pair 12), and conductive paths 7 and 8 (i.e., pair 78). In this respect, the connectors in the transmission channel may be RJ45 connectors, and the cables may include four twisted-pair copper conductors, or in other words, eight conductors total. Other arrangements are possible as well.

Figure 2:
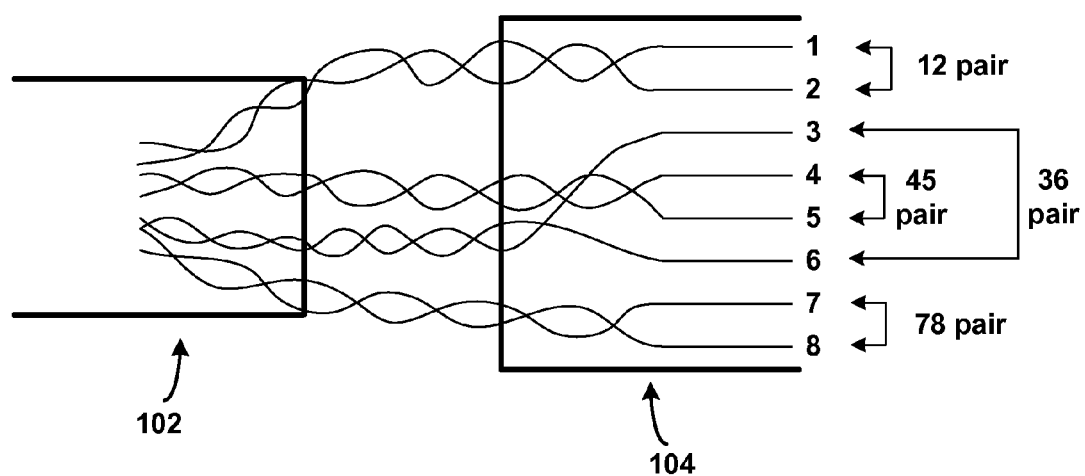
FIG. 2 illustrates an exemplary first cable terminated at an exemplary communication plug.

FIG. 2 illustrates an exemplary first cable 102 terminated at an exemplary communication plug 104. As shown, the exemplary first cable 102 may be a four twisted-pair cable with wires 1-8, where wires 4 and 5 are a twisted pair, wires 3 and 6 are a twisted pair, wires 1 and 2 are a twisted pair, and wires 7 and 8 are a twisted pair. The exemplary communication plug 104 may be an RJ45 plug with contacts 1-8. During termination of the cable 102 with the plug 104, the cable's twisted pairs are typically untwisted at one end, and the wires are then inserted into the plug 104 such that cable wires 1-8 align with plug contacts 1-8. The plug contacts are then crimped down onto the cable wires, resulting in electrical connection between the cable wires and plug contacts.

The close proximity of conductive paths (e.g., terminated wires and contacts) in the communication plug 104 may result in capacitive and/or inductive coupling between these conductive paths. The amount of coupling is highly dependent on the relative proximity of the conductive paths, with a smaller distance between the conductive paths providing stronger coupling (greater capacitance) and a larger distance between conductive paths providing weaker coupling (lesser capacitance). This can be generally understood in part by the equation:

$$C = \varepsilon A/d \quad \text{(Equation 1)}$$

where C is a capacitance between conductive paths, A is an area of the conductive paths that are separated by a dielectric material (e.g., air, or other dielectrics) of permittivity e, and d is a distance between the conductive paths. The amount of crosstalk coupling within the plug between each pair combination is specified as a range within the ANSI/TIA/EIA-568-B.2-1 and ISO 11801 standards. The highest amount of crosstalk allowed within the plug is between pair combination 45-36, followed by 36-12 and 36-78, then 45-12 and 45-78, and the least amount of crosstalk is on pair combination 12-78. This can be generally understood by looking at the geometry of plug 104, as shown in FIG. 2 and described above.

For two pairs of conductive paths, there are four different ways in which individual conductive paths can interact, and thus four possible coupling elements. Because of the nature of the differential signals on the pairs, two of the coupling elements are typically of a first polarity, and the other two coupling elements are of a second polarity that is typically opposite of the first polarity. The composite of the coupling elements between conductive path pairs may in turn result in crosstalk between those conductive path pairs, which may interfere with data transmission over the conductive path pairs in the transmission channel 100.

In a communication plug 104 with four conductive path pairs, such as the RJ45 plug depicted in FIG. 2, there are six conductive path pair combinations that may exhibit crosstalk: 45-36, 36-12, 36-78, 45-12, 45-78, and 12-78. Typically, however, the crosstalk between two conductive paths is considered negligible from a practical standpoint if those paths are separated by at least four other conductive paths. As such, pair combination 12-78 may exhibit negligible interpair crosstalk. However, each of the other pair combinations may exhibit a non-negligible amount of interpair crosstalk.

Pair combination 45-36 typically exhibits the largest amount of interpair crosstalk, because pair 36 splits across pair 45 at the termination point. In pair combination 45-36, conductive paths 3 and 4 and conductive paths 5 and 6, both of which are adjacent to one another, may introduce predominant crosstalk elements of a certain polarity referred to here as positive. On the other hand, conductive paths 3 and 5 and conductive paths 4 and 6, both of which are separated by one conductive path, may introduce predominant crosstalk elements of an opposite polarity referred to here as negative. The difference between positive and negative polarity is a 180° phase difference. As such, the amount of interpair plug crosstalk for pair combination 45-36 may be represented as:

$$PXT_{45\text{-}36} = C_{43} + C_{56} - (C_{46} + C_{35}) \quad \text{(Equation 2)}$$

In pair combination 36-12, conductive paths 2 and 3, which are adjacent to one another, may introduce a predominant crosstalk component of a certain polarity referred to here as positive. On the other hand, conductive paths 1 and 3, which are separated by one conductive path, may introduce a predominant crosstalk component of an opposite polarity referred to here as negative. Conductive paths 1 and 6 may also introduce a positive polarity crosstalk component, but this component may be negligible because of the separation between these conductive paths. Similarly, conductive paths 2 and 6 may introduce a negative polarity crosstalk component, but this component may be negligible because of the separation between these conductive paths. As such, the amount of interpair plug crosstalk for pair combination 36-12 may be represented as:

$$PXT_{36\text{-}12} = C_{23} - C_{13} \quad \text{(Equation 3)}$$

In pair combination 36-78, conductive paths 6 and 7, which are adjacent to one another, may introduce a predominant crosstalk component of a certain polarity referred to here as positive. On the other hand, conductive paths 6 and 8, which are separated by one conductive path, may introduce a predominant crosstalk component of an opposite polarity referred to here as negative. Conductive paths 3 and 8 may also introduce a positive polarity crosstalk component, but this component may be negligible because of the separation between these conductive paths. Similarly, conductive paths 3 and 7 may introduce a negative polarity crosstalk component, but this component may be negligible because of the separation between these conductive paths. As such, the amount of interpair plug crosstalk for pair combination 36-78 may be represented as:

$$PXT_{36\text{-}78} = C_{67} - C_{68} \quad \text{(Equation 4)}$$

In pair combination 45-12, conductive paths 2 and 4, which are separated by one conductive path, may introduce a predominant crosstalk component of a certain polarity referred to here as positive. On the other hand, conductive paths 1 and 4 and conductive paths 2 and 5, both of which are separated by two conductive paths, may introduce predominant crosstalk elements of an opposite polarity referred to here as negative. Conductive paths 1 and 5 may also introduce a positive polarity crosstalk component, but this component may be negligible because of the separation between these conductive paths. As such, the amount of interpair plug crosstalk for pair combination 45-12 may be represented as:

$$PXT_{45\text{-}12} = C_{42} - (C_{41} + C_{52}) \quad \text{(Equation 5)}$$

In pair combination 45-78, conductive paths 5 and 7, which are separated by one conductive path, may introduce a predominant crosstalk component of a certain polarity referred to here as positive. On the other hand, conductive paths 4 and 7 and conductive paths 5 and 8, both of which are separated by two conductive paths, may introduce predominant crosstalk elements of an opposite polarity referred to here as negative. Conductive path 4 and 8 may also introduce a positive polarity crosstalk component, but this component may be negligible because of the separation between these conductive paths. As such, the amount of interpair plug crosstalk for pair combination 45-78 may be represented as:

$$PXT_{45\text{-}75} = C_{57} - (C_{47} + C_{58}) \quad \text{(Equation 6)}$$

Figure 3:
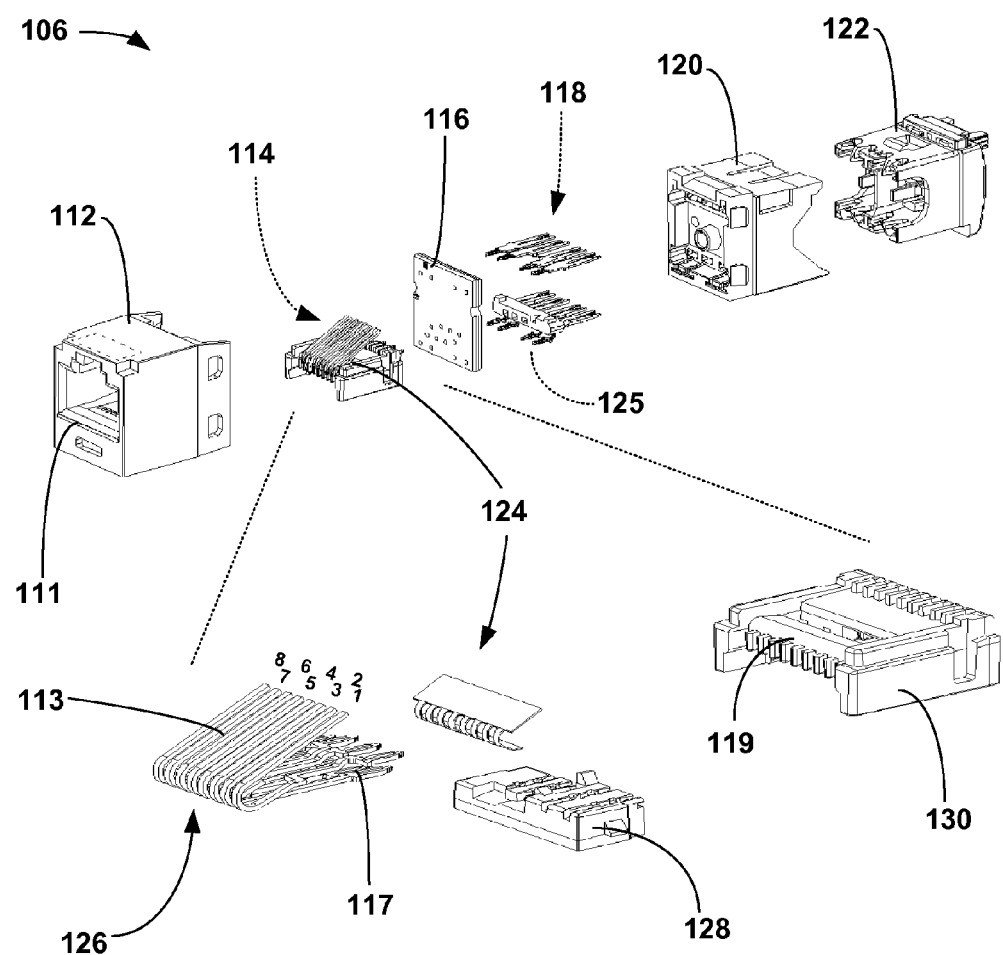
FIG. 3 is an exploded perspective illustration of an exemplary communication jack.

An exemplary communication jack will now be described with reference to FIGS. 3-6. FIG. 3 is an exploded perspective illustration of the exemplary communication jack 106. FIGS. 4-5 illustrate a side view of the exemplary communication jack 106, without and with a mated communication plug 104, respectively. FIG. 6 illustrates a rear view of the exemplary communication jack 106 with wire cap 122 removed. The exemplary communication jack 106 is preferably an RJ45 jack capable of meeting Category 6 standards, as defined in ANSI/TIA/EIA-568-B.2-1. As shown, the communication jack 106 may include a housing 112, a nose 114, a rigid board 116, insulation displacement contacts (IDCs) 118, and a rear sled 120. The exemplary communication jack 106 may include other components as well. For example, communication jack 106 is shown as a modular unshielded jack. Communication jack 106 could also be a punchdown jack or a shielded modular jack.

The housing 112 may have an opening 111 that accepts the communication plug 104. The nose 114 may sit within the housing 112 and provide an interface between the communication plug contacts and the rigid board 116. In this respect, as shown, the nose 114 may include a plurality of plug interface contacts (PICs) 126 that may each couple with a corresponding plug contact at a first end, 113 and that each engage a corresponding via 123A-H plated through hole (see FIGS. 4, 5 and 11) in the rigid board 116 at a second end with compliant pins 117. Preferably, as shown, PICs 126 are wrapped around a mandrel 119, in which case the PICs 126 each include a concave bend between the first end 113 and the second end 117. The PICs 126 may be supported in nose 114 by a bottom front sled 128 and a top front sled 130, each mechanically attached to the PICs 126 near the second end.

Nose 114 may also include a flex board 124, which may include elements that provide crosstalk compensation when the flex board 124 is in contact with the PICs 126. As shown, the flex board 124 preferably has a concave bend similar to that of the PICs 126, especially when wrapped around the same mandrel 119 as PICs 126, and includes conductive traces 121 on at least one side that facilitate electrical connection with the PICs 126. In this respect, the flex board 124 may be located between the first end 113 and second end 117 of the PICs 126, such that the front end of each PIC 126 makes contact with corresponding conductive traces 121 of the flex board 124. This contact point between the PICs 126 and flex board 124 is preferably in close proximity to the contact point between the PICs 126 and the plug contacts in order to minimize the electrical distance between the source of crosstalk in the plug and the compensation capacitors C26, C35, C46 and C37, and consequently maximize the effectiveness of the crosstalk compensation located on the flex board. As shown particularly in FIG. 5, flex board 124 first contacts PICs 126 at flex contact point 127. Main capacitor area 129 extends approximately horizontally (as shown in FIG. 5) from mandrel 119. Plug contacts 131 contact PICs 126 at plug contact point 133. The electrical distance to be minimized is the distance between plug contact point 133 and the centroid 143 (composite "center of mass" of compensation capacitors C26, C35, C46 and C37 including lengths of interconnecting traces; approximately 0.060 inches along the respective conductive traces from the flex contact point 127) of compensation capacitors C26, C35, C46 and C37. Ideally this electrical distance is zero, i.e., directly under plug contact point 133. However, a compensation capacitor of the appropriate value and with infinitesimally small extent would need to be placed directly at plug contact point 133, which is not practically achievable. Additionally, this ideal location creates mechanical design challenges in that comb elements 135 on plug 104 are interlaced between individual PICs 126. Consequently, such a design is highly constrained relative to the location of the compensation capacitors (located directly under PICs 126) and the size of the compensation capacitors (should not extend laterally beyond PICs 126), so as to avoid interfering with comb elements 135. Additionally, locating the compensation capacitors directly under plug contact point 133 can create other challenges such as difficulty in maintaining reliable electrical contact between the compensation capacitors and PICs 126 after repeated insertion/retraction cycling of the plug relative to the jack; and difficulty in being able to pass high voltage breakdown (hi-potential, per UL 1863) testing on the jack.

Within FIG. 5, the polarities of the different crosstalk elements are highlighted. The plug 104 is shown to introduce crosstalk of a polarity "+." The flex board 124 and rigid board 116 are both shown to introduce crosstalk of an opposite polarity to the crosstalk of the plug, represented by "$-^i$" and "$-^{ii}$", respectively. These polarities of each element are net polarities, and do not attempt to highlight any of the parasitic couplings from the distributed elements found throughout the connector. For the layout and design shown particularly in FIG. 5, calculating the electrical distance between plug contact point 133 and the centroid 143 of compensation capacitors C26, C35, C46 and C37 can be difficult because plug contacts 131, PICs 126, and compensation capacitors C26, C35, C46 and C37 are exposed to many different boundary conditions, i.e., these are not a single conductor of constant cross-section surrounded by a uniform dielectric, also of constant cross-section. In contrast, the layout and design shown particularly in FIG. 5 represents multiple different conductors (plug contacts 131, PICs 126, and the conductors and capacitors of flex board 124) of varying cross-sections surrounded by a variety of non-uniform dielectrics (air, the plastic of plug 104, the plastic of bottom front sled 128 and top front sled 130 and flexible substrate 140) also of varying cross-sections and relative positions with respect to the conductors.

Nevertheless, a reasonable calculation can be made of the electrical distance between plug contact point 133 and the centroid 143 of compensation capacitors C26, C35, C46 and C37. The worst-case electrical distance between plug contact point 133 and the centroid 143 of compensation capacitors C26, C35, C46 and C37, in phase difference, is at the highest operating frequency, which for a CAT6 jack (operating at 0-250 MHz) is 250 MHz. That is because wavelength (360° of phase change) is inversely proportional to frequency; consequently, a given physical distance from plug contact point 133 at the highest operating frequency represents more phase change than for the same physical distance at a lower frequency.

For the embodiment shown, the physical distance between plug contact point 133 and the centroid 143 of compensation capacitors C35 and C46 along the conductors is approximately 0.225 inches. Assuming a composite relative dielectric constant of 2.5 along this same path, this physical distance is equivalent to an electrical phase of approximately 2.7 degrees at 250 MHz. The calculated maximum allowable electrical phase distance, while still meeting current CAT6 ANSI/TIA/EIA-568-B.2-1 NEXT standards with approximately 1.5 dB of margin, is approximately 3.3 degrees, as a one-way trip from plug contact point 133, and assuming that the source of crosstalk is effectively at approximately 0.090 inches (1.1 degrees of electrical phase) into the plug from plug contact point 133. However, this calculation is accurate under relatively ideal conditions, and such conditions are not achievable in a real jack. The signal conductive paths (pairs 12, 36, 45 and 78) of the present invention each comprise a transmission line which includes corresponding PICs 126, traces on flex board 124, traces on the rigid board 116, and IDCs 118. As with any similar transmission line, associated therewith are distributed electrical parameters (typically distributed resistance, capacitance, inductance, and conductance), which create what are sometimes called parasitic, or unintended, coupling elements such as parasitic capacitance and inductance. The "parasitic" moniker is a result of these elements typically degrading jack performance relative to the ideal performance, although they can sometimes work to help performance. In addition to the distributed electrical parameters of the transmission conductors, lumped, discrete elements such as the compensation and return loss capacitors on flex board 124 and rigid board 116 additionally have distributed electrical parameters associated therewith, which can degrade (or possibly help) the jack performance from the ideal. Consequently, in a real jack, the maximum allowable physical distance between plug contact point 133 and the centroid 143 of compensation capacitors C35 and C46 (C26 and C37 can be farther away, but will also work with the stated maximum), or any other compensation elements that are placed on flex board 124, in electrical phase distance, is preferably 3.0 degrees, with a more preferred range of between 1.5 degrees and 3.0 degrees. For the embodiment shown, an even more preferred range of physical distance between plug contact point 133 and the centroid 143 of at least compensation capacitors C35 and C46 (C26 and C37 can be farther away, but will also work with the stated range) is between 2.5 degrees and 2.9 degrees of electrical phase difference. All of these electrical phase differences between plug contact point 133 and the centroid of any compensation capacitors on the flex board are for the highest of the signal operating frequencies, which for CAT6 operation is 250 MHz. For lower operating frequencies, such as CAT5e (100 MHz max.), the present invention is scalable. For CAT6A operating at a maximum operation frequency of 500 MHz, the present invention is scalable as long as one takes into consideration the associated NEXT specification at 500 MHz and balance considerations necessary to meet CAT6A alien crosstalk specifications.

The minimal electrical distance between the source of crosstalk in the plug and the compensation capacitors C26, C35, C46 and C37 reduces or eliminates phase differences between the crosstalk and compensation, particularly at increasing operating frequencies, which maximizes the effectiveness of the crosstalk compensation.

Rigid board 116 may include two sets of plated through hole vias, including one set (123A-H) to interface with the compliant pins on PICs 126 (i.e., PIC vias) and one set (115A-H) to interface with the compliant pins 125 on insulation displacement contacts (IDCs) 118. In turn, the rigid board 116 may include a plurality of conductive traces (see particularly FIGS. 11 and 12), each of which extends between a PIC via and a corresponding IDC via. In this respect, rigid board 116 provides an interface between PICs 126 and IDCs 118. Rigid board 116 may also include other elements (C14, C36 and C58) that provide crosstalk compensation and/or other types of compensation, as described in more detail below.

IDCs 118 may sit predominantly within rear sled 120 and provide an interface between rigid board 116 and second cable 108. In this respect, the IDCs 118 may each engage a corresponding plated through hole via 115A-H in rigid board 116 at a first end, and may each terminate a corresponding wire of the second cable 108 at a second end. To facilitate easy termination of the cable wires in the IDCs 118, communication jack 106 may additionally include a wire cap 122, which may be a separate component that contains and configures the wires of the second cable 108 before termination with the IDCs 118. Once the wires are seated in the wire cap 122, the wire cap 122 may be snapped together with the rear sled 120, resulting in the electrical connection of the wires with the IDCs 118.

Within the exemplary communication jack 106, each conductive path may include a PIC 126, a trace on flex board 124, a trace on the rigid board 116, and an IDC 118. These conductive paths may extend from an input terminal (e.g., the first end of the PICs 126) to an output terminal (e.g., the second end of the IDCs 118) of the communication jack 106. The close proximity of conductive paths in the communication jack 106 may result in relatively minor capacitive and/or inductive parasitic coupling between these conductive paths. These capacitive and inductive couplings can be the result of distributed and/or discrete electrical parameters. This parasitic coupling between conductive paths in the communication jack 106 may also contribute to the crosstalk generated in the communication plug 104.

To compensate for the crosstalk generated in the communication plug 104 and/or communication jack 106, the communication jack 106 preferably includes crosstalk compensation. In particular, the communication jack 106 preferably includes crosstalk compensation for each conductive path pair combination that exhibits non-negligible crosstalk (e.g., pair combinations 45-36, 36-12, 36-78, 45-12, and 45-78). Ideally, a communication jack's crosstalk compensation is located as close to the plug contacts as possible (e.g., in the nose 114), so as to minimize a phase difference between the offending crosstalk and the crosstalk compensation. Given the limited area (particularly on flex board 124) in the nose 114 of communication jack 106, however, it is difficult to provide effective crosstalk compensation for all pair combinations near the contact point between the plug 104 and jack 106.

The exemplary communication jack 106 distributes the crosstalk compensation between two circuit boards—the flex board 124 and the rigid board 116 with only a single stage of compensation, on either the flex board or rigid board, for each pair combination. In the context of this disclosure, a stage is considered a collection of compensation elements for a particular pair combination, with those compensation elements all located at approximately the same distance from the plug contacts when the plug is mated to the jack. For example, and referring particularly to FIGS. 7 and 8, the compensation for pair combination 45-36 includes C46 and C35, in order to implement physically small capacitors and minimize the centroid distance from the contact point 127. Consequently, this compensation has been split into two capacitors. However, these two capacitors are considered a single stage because they are approximately the same electrical distance (same phase) from the corresponding mated plug contacts. The exemplary communication jack 106 may include single stage crosstalk compensation for the more problematic pair combinations (i.e., the pair combinations with higher crosstalk, such as pairs 45-36, 36-12 and 36-78) on the flex board 124, which is in close proximity to the plug contacts. In this respect, the exemplary communication jack 106 may reduce the phase differences between the offending crosstalk and crosstalk compensation for the most problematic pairs. In turn, the exemplary communication jack 106 may include single stage crosstalk compensation for the less problematic pair combinations (i.e., the pair combinations with lower crosstalk, i.e., 45-12 and 45-78) on the rigid board 116, which is not in close proximity to the plug contacts. In this respect, because of the lower crosstalk on these pair combinations, the phase differences between the offending crosstalk and crosstalk compensation are of less concern.

By distributing the crosstalk compensation in this manner, the exemplary communication jack 106 is able to provide more effective crosstalk compensation for the more problematic pair combinations. In particular, by dedicating the limited area of the flex board 124 to the more problematic pair combinations, as opposed to all pair combinations, jack designers are able to more completely compensate for the crosstalk in those pair combinations on the flex board 124. Similarly, jack designers are able to fully compensate for the crosstalk in the less problematic pair combinations in the rigid board 116. This reduces or eliminates a need for multiple stages of crosstalk compensation, which may in turn reduce the complexity and cost of jack design and improve manufacturability. Additionally, removal of the second stages reduces the amount of capacitors needed on the jack and can generally greatly improve the overall return loss of the connector.

Generally speaking, as used herein, the term "single stage jack" refers to a jack in which the intentional primary mechanism for correcting NEXT in a mated plug and jack is accomplished through only a single stage of compensation. It is well understood that essentially all mated plug and jacks have many unintentional compensation and crosstalk elements caused by parasitic elements inherent in the overall layout and structure of the jack. These elements provide a relatively minor effect to the overall NEXT performance of the jack. However, in a single stage compensation network, the primary mechanism for correcting the crosstalk caused by the plug (particularly at higher frequencies) is located in only one stage. This single stage can be identified as a specific capacitor purposely designed into the system and the magnitude of this capacitor is generally larger in magnitude than any of the other capacitances in the system for that pair combination. With respect to what is considered a single stage compensation scheme, removing or changing any unintentional compensation or crosstalk (within reason) only requires adjusting the magnitude of this single stage (either up or down) to account for this change and ensure cancellation at low frequencies. However, removal of that single stage capacitor ensures that the overall jack would not meet NEXT requirements no matter what else could be done in any of the other regions.

Figure 7:
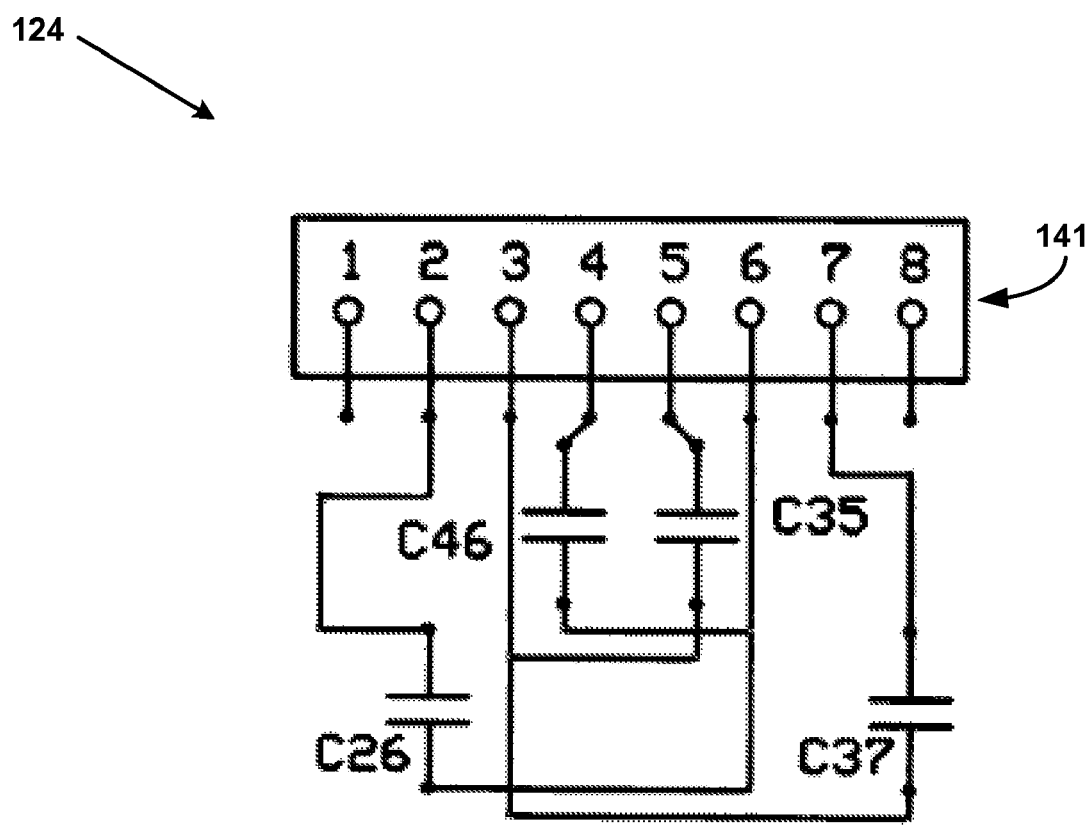
FIG. 7 is a schematic diagram of an exemplary flex board.
Figure 8:
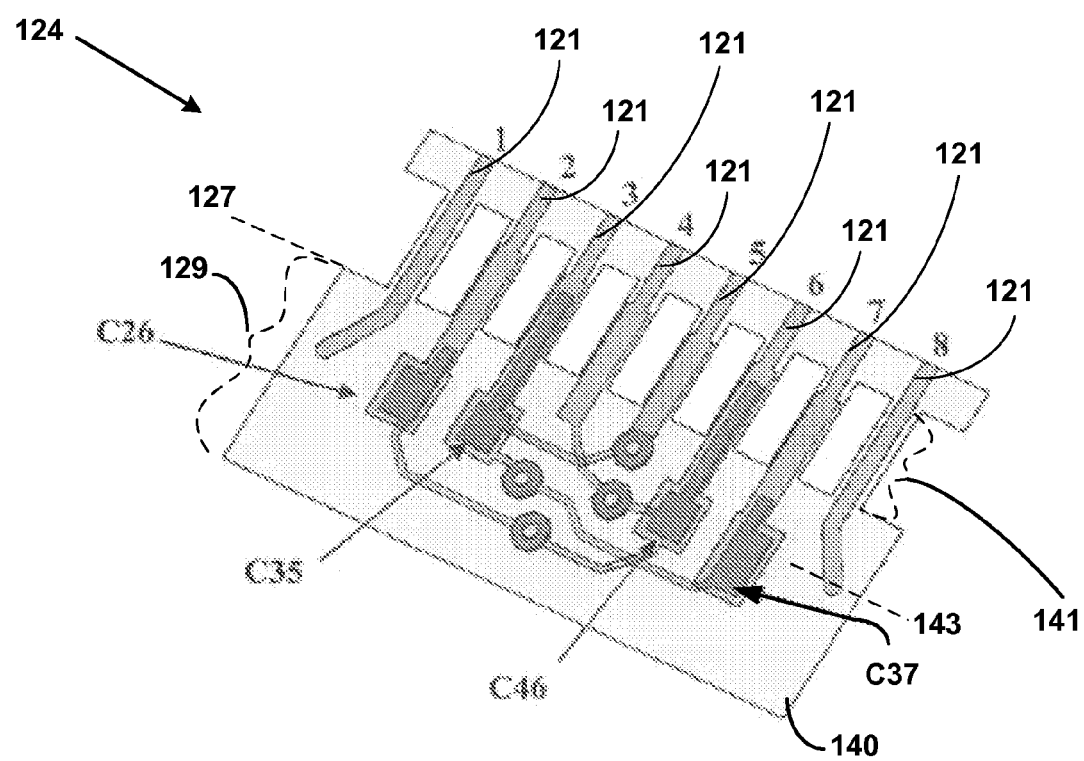
FIG. 8 is an isometric view of the exemplary flex board prior to conforming to the front sled.
Figure 9:
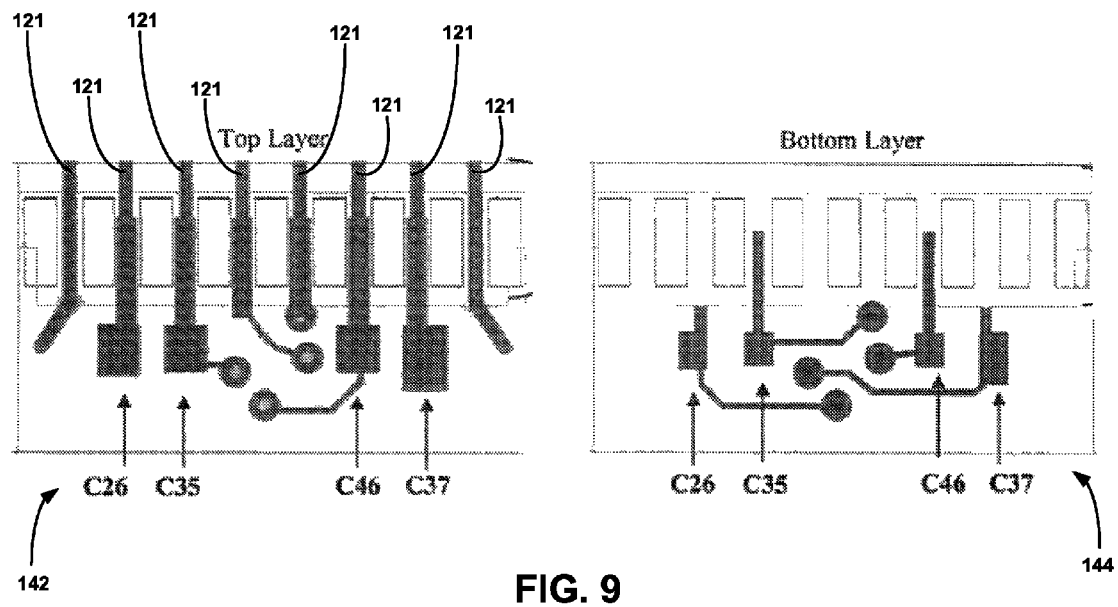
FIG. 9 is the individual layers of the exemplary flex board.

An exemplary flex board 124 is now described with references to FIGS. 7-9. FIG. 7 is a schematic diagram of the exemplary flex board 124. FIG. 8 illustrates an isometric view of the exemplary flex board 124. FIG. 9 illustrates the individual layers of the exemplary flex board 124. Flex board 124 is a printed circuit board made up of a flexible substrate 140 with a dielectric constant ($\in_r$) of about 3.4. Substrate 140 is 0.001" thick and separates top layer 142 from bottom layer 144. The flex board wraps around mandrel 119 of the front sled 130 where its top layer 142 makes contact with the PICs 126 that also wrap around the same mandrel. The flex board contact area 141 is also referred to as "fingers" due to the thin nature of this region. The fingers are an exposed gold plated copper region created by cutting away parts of the circuit board. This cutout is made to locate flex board 124 on front sled 130.

Pad capacitors C26, C35, C46 and C37 are created between the top layer 142 and bottom layer 144 on flex board 124. These pad capacitors add compensating crosstalk for pair combinations 45-36, 36-12, and 36-78. These pair combinations are located within the flex board in order to minimize their distance from the plug. Pair 45-36 is compensated by capacitors C35 and C46, pair 36-12 is compensated by capacitor C26, and pair 36-78 is compensated by capacitor C37.

The compensation on pair combination 45-36 is unique in that the compensation also includes capacitance extending into region 141 under fingers 121 where the flex board is in contact with the PICs. This was done to reduce the distance from the plug to these capacitors. By placing these capacitors under the PICs, it is possible to gain more margin with NEXT by minimizing the distance between the source of the crosstalk (Plug) and source of the compensational flex board. The compensation for NEXT on pair 45-36 is split into two capacitors because, given the thickness and dielectric of substrate 124 and the general geometry of flex board 124, a single capacitor of the appropriate size would tend not to be as close to the plug as these two capacitors.

Thus, the flex board 124 may include a compensation element coupled between conductive paths 4 and 6 ($C_{46}$), a compensation element coupled between conductive paths 3 and 5 ($C_{35}$), and/or some combination thereof. As shown in FIGS. 7-9, the exemplary flex board 124 may include both compensation element C35 and compensation element C46, each of which may be formed across both the main area of the PCB and the fingers. Preferably, the compensation elements C35 and C46 combine to provide the only stage of crosstalk compensation for pair combination 45-36. Two relatively large capacitors C35 and C46 are needed for pair combination 45-36 because of the relatively large crosstalk in the plug for pair combination 45-36. In this respect, a distance (and time delay) between the compensation element C35 and its contact points 127 and a distance (and time delay) between compensation element C46 and its contact points will preferably be substantially the same. In one example, the compensation elements C35 and C46 may each be a pad capacitor with a surface area of approximately 0.0011 inches$^2$ (±20%) and a capacitance of approximately 0.9 pF. Other examples are possible as well.

To compensate for the crosstalk in pair combination 36-12, the flex board 124 may include a compensation element coupled between conductive paths 1 and 3 ($C_{13}$), a compensation element coupled between conductive paths 2 and 6 ($C_{26}$), and/or some combination thereof. As shown in FIGS. 7-9 and mentioned above, the exemplary flex board 124 includes only compensation element C26. In one example, the compensation element C26 may be a pad capacitor with a surface area of approximately 0.000674 inches$^2$ (±20%) and a capacitance of approximately 0.6 pF. Other examples are possible as well.

To compensate for the crosstalk in pair combination 36-78, the flex board 124 may include a compensation element coupled between conductive paths 3 and 7 ($C_{37}$), a compensation element coupled between conductive paths 6 and 8 ($C_{68}$), and/or some combination thereof. As shown in FIGS. 7-9, the exemplary flex board 124 includes only compensation element C37. In one example, the compensation element C37 may be a pad capacitor with a surface area of approximately 0.0011 inches$^2$ (±20%) and a capacitance of approximately 0.9 pF. Other examples are possible as well.

Figure 10:
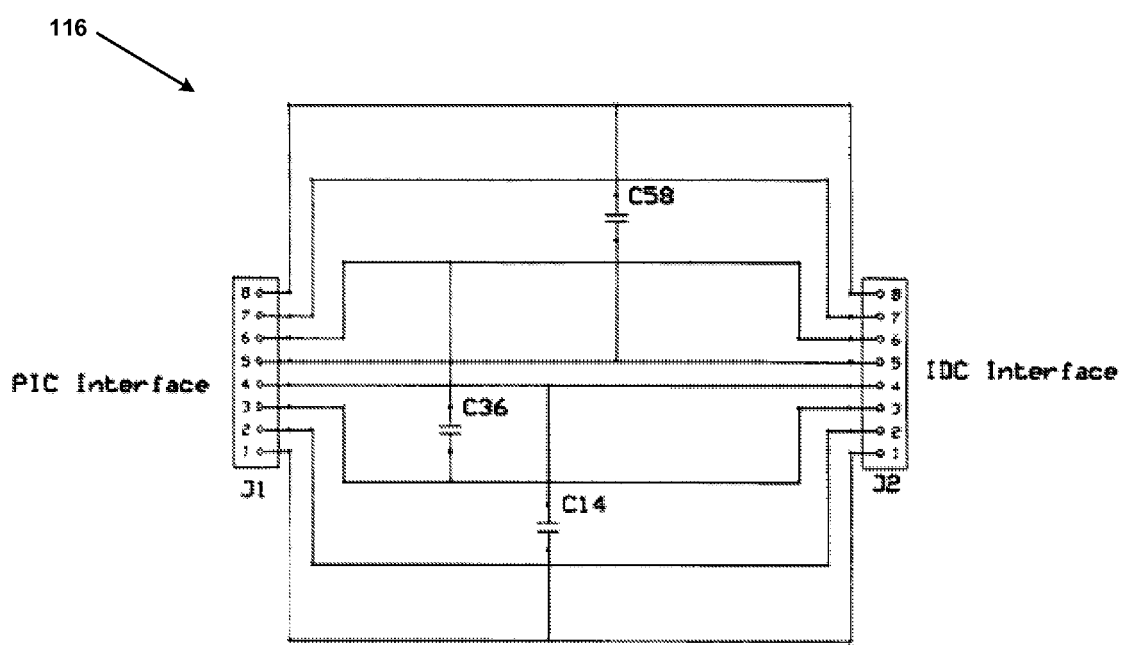
FIG. 10 is a schematic diagram of the exemplary rigid board.
Figure 11:
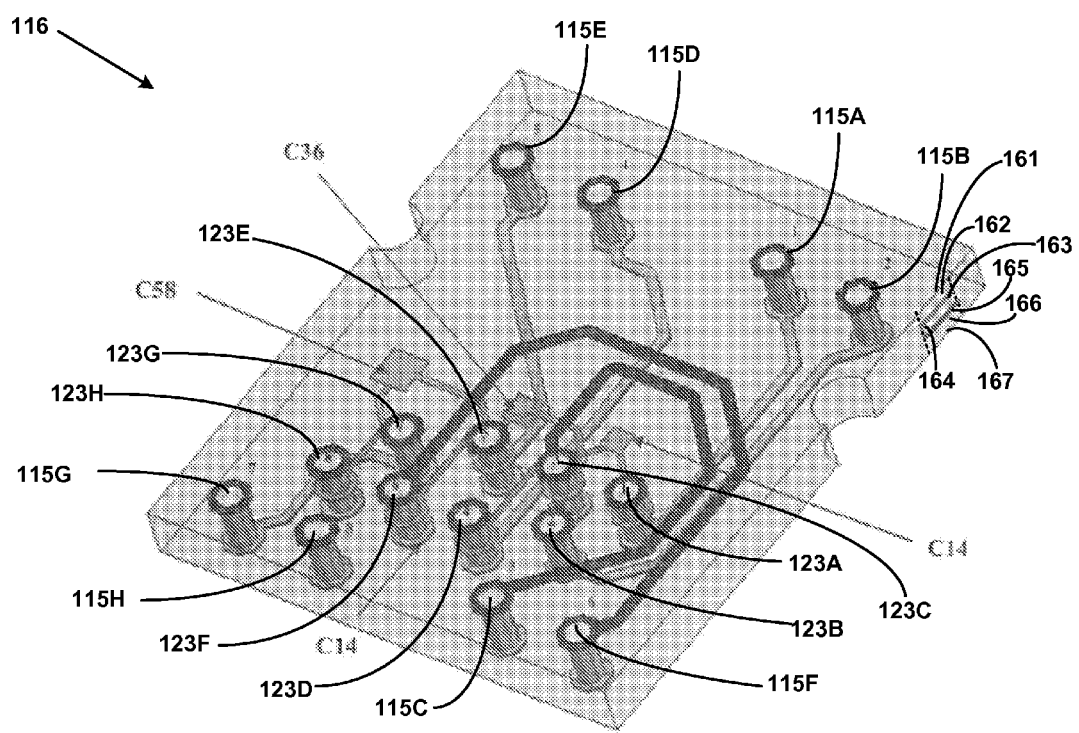
FIG. 11 is an isometric view of the exemplary rigid board.
Figure 12:
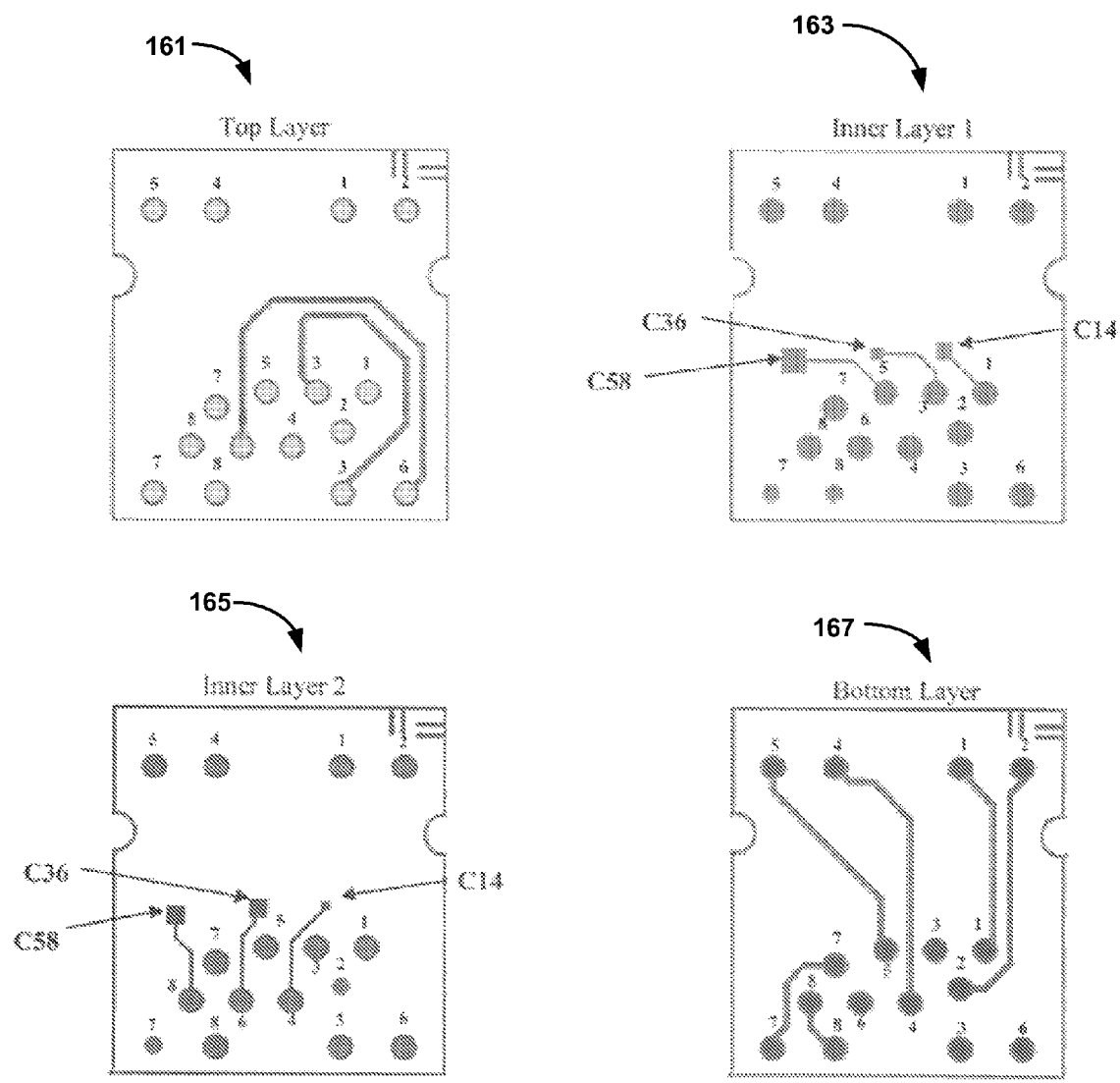
FIG. 12 is the individual layers of the exemplary rigid board.

An exemplary rigid board 116 is described with reference to FIGS. 10-12. FIG. 10 is a schematic diagram of the exemplary rigid board 116. FIG. 11 illustrates an isometric view of the exemplary rigid board 116. FIG. 12 illustrates the individual layers of the exemplary rigid board 116. Rigid board 116 is a 4 layer printed circuit board. Rigid board 116 includes a 0.025" laminate layer 162 separating the top conductive trace layer 161 from inner conductive trace layer 1 (163), a 0.004" core substrate layer 164 separating inner layer 1 (163) from inner conductive trace layer 2 (165), and a 0.025" laminate layer 166 separating inner layer 2 (165) from the bottom conductive trace layer 167.

The rigid board 116 connects the PICs 126 of nose 114 to the IDCs 118, and additionally provides single stage compensation for pair combinations 45-12 (C14) and 45-78 (C58), and a return loss element C36 for Pair 36. The PICs 126 and IDCs 118 connect to the rigid board 116 by means of plated through hole vias (123A-H and 115A-H, respectively) on the rigid board. Traces on the top layer 161 and bottom layer 167 of the rigid board connect each conductive path on the PICs 126 to its corresponding conductive path on the IDCs 118.

Pad capacitors are created between inner layer 1 (163) and inner layer 2 (165). These pad capacitors add compensating crosstalk for pair combinations 45-12 and 45-78. Due to the lower amount of crosstalk caused by the plug, these capacitors do not need to be placed as close to the plug, so they are placed further away in the rigid circuit board 116 (although they could be placed on the flexible circuit board 124). Pair 45-12 is compensated by capacitor C14 and pair 45-78 is compensated by C58.

Another pad capacitor C36 between inner layer 1 (163) and inner layer 2 (165) is used to improve the return loss on pair 36. C36 adds capacitance between wires 3 and 6 in order to lower the impedance of that region to achieve better overall return loss.

Therefore, as described above, the rigid board 116 preferably includes the only stage of crosstalk compensation for the less problematic pair combinations. For example, the rigid board 116 may include the only stage of crosstalk compensation, C14 and C58, for pair combinations 45-12 and 45-78, respectfully. The compensation element(s) for each pair combination preferably has a polarity opposite to that of the composite crosstalk element for that pair combination. In one example, the compensation elements may be pad capacitors, each having a first pad on one layer of the rigid board 116 and a second pad on another layer of the rigid board 116 as indicated particularly in FIGS. 11 and 12. As shown in FIGS. 11 and 12, the pad capacitors may be located on the inner layers of the rigid board 116, but may also be located on the outer layers of the rigid board 116. Further, as shown, the pad capacitors may be connected between the PIC vias, but may also be connected at some other location along the conductive path between the PIC vias and the IDC vias. Additionally, the compensation capacitors can be realized with interdigitized capacitors, other discrete capacitors mounted on rigid board 116, other capacitors based on distributed electrical parameters, and a combination of distributed and discrete components.

To compensate for crosstalk in pair combination 45-12, the rigid board 116 may include a compensation element coupled between conductive paths 1 and 4 ($C_{14}$), a compensation element coupled between conductive paths 2 and 5 ($C_{25}$), and/or some combination thereof. As shown in FIGS. 10-12, the exemplary rigid board 116 includes only compensation element C14. In one example, the compensation element C14 may be a pad capacitor with an area of approximately 0.01 inches×0.01 inches (±20%) and a capacitance of approximately 0.2 pF. Other examples are possible as well.

To compensate for the crosstalk in pair combination 45-78, the rigid board 116 may include a compensation element coupled between conductive paths 4 and 7 ($C_{47}$), a compensation element coupled between conductive paths 5 and 8 ($C_{58}$), and/or some combination thereof. As shown in FIGS. 10-12, the exemplary rigid board 116 includes only compensation element C58. In one example, compensation element C58 may be a pad capacitor with an area of approximately 0.03 inches by 0.03 inches (±20%) and a capacitance of approximately 0.4 pF. Other examples are possible as well.

In addition to the crosstalk compensation, the rigid board 116 may also include other types of compensation, such as return loss compensation. For example, the rigid board 116 may include return loss compensation for conductive path pairs with poor return loss performance. This return loss compensation on the rigid board 116 may take the form of one or more discrete capacitive compensation elements, each coupled between a pair's two conductive paths. The capacitive compensation elements are used to ensure that the overall impedance of that region is closer to 100 ohms in order to provide the optimal return loss performance for that pair. In one example, the compensation element may be a pad capacitor having a first pad on one layer of the rigid board 116 and a second pad on another layer of the rigid board 116. As shown in FIGS. 11-12, the pad capacitor(s) may be located on the inner layers of the rigid board 116, but may also be located on the outer layers of the rigid board 116. Further, as shown, the pad capacitor(s) may be connected between the PIC vias, but may also be connected at some other location along the conductive path between the PIC vias and the IDC vias.

As shown in FIGS. 10-12, to improve the return loss on pair 36, the exemplary rigid board 116 may include a compensation element C36. In one example, the compensation element C36 may be a pad capacitor with an area of approximately 0.02 inches×0.02 inches (±20%) and a capacitance of approximately 0.3 pF. Other examples are possible as well.

While this invention has been described as having a preferred design, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

The invention claimed is:

1. A communication jack for compensating a source of crosstalk in a mated communication plug over a range of signal operating frequencies, comprising:
a housing having a first face with a plug receiving aperture therein;
a plurality of conductive path pairs extending from corresponding plug interface contacts located at said plug receiving aperture to corresponding output terminals, said plurality of conductive path pairs including a first circuit board connected to said plug interface contacts and a second circuit board connected to said output terminals, said first circuit board including a first single stage of crosstalk compensation with opposite polarity of the crosstalk of the plug for at least one combination of said conductive path pairs, said second circuit board including a second single stage of crosstalk compensation with opposite polarity of the crosstalk of the plug for at least some of said conductive path pairs not compensated on said first circuit board, wherein said stages cancel substantially all of the crosstalk caused by the plug over the range of the signal operating frequencies, for corresponding combinations of said plurality of conductive path pairs.

2. The communication jack of claim 1, wherein said first circuit board contacts said conductive path pairs at said plug interface contacts and does not contact said output terminals.

3. The communication jack of claim 1, wherein at least one of said first single stage of crosstalk compensation and said second single stage of crosstalk compensation includes a pad capacitor.

4. The communication jack of claim 1, wherein said second circuit board further includes a return loss compensation for at least one of said conductive path pairs.

5. The communication jack of claim 1, wherein said plurality of conductive path pairs includes a first pair corresponding to conductive paths 1 and 2, a second pair corresponding to conductive paths 3 and 6, a third pair corresponding to conductive paths 4 and 5, and a fourth pair corresponding to conductive paths 7 and 8, and wherein said first single stage of crosstalk compensation includes respective compensation capacitors for a first pair combination corresponding to the second pair and the third pair, a second pair combination corresponding to the first pair and the second pair, and a third pair combination corresponding to the second pair and the fourth pair.

6. The communication jack of claim 5, wherein said second single stage of crosstalk compensation includes respective compensation capacitors for a fourth pair combination corresponding to the first pair and the third pair, and a fifth pair combination corresponding to the third pair and the fourth pair.

7. A communication system for connection to at least one communication plug over a range of signal operating frequencies, the communication plug having a source of crosstalk, said communication system comprising:
   electrical equipment having at least one jack receiving aperture;
   a communication jack connected to said electrical equipment at said jack receiving aperture, said communication jack including a housing having a first face with a plug receiving aperture therein; a plurality of conductive path pairs extending from corresponding plug interface contacts located at said plug receiving aperture to corresponding output terminals, said plurality of conductive path pairs including a first circuit board connected to said plug interface contacts and a second circuit board connected to said output terminals, said first circuit board including a first single stage of crosstalk compensation with opposite polarity of the crosstalk of the plug for at least one combination of said conductive path pairs, said second circuit board including a second single stage of crosstalk compensation with opposite polarity of the crosstalk of the plug for at least some of said conductive path pairs not compensated on said first circuit board, wherein said stages cancel substantially all of the crosstalk caused by the plug, for all of the signal operating frequencies, for corresponding combinations of said plurality of conductive path pairs.

8. The communication system of claim 7, wherein at least one of said first single stage of crosstalk compensation and said second single stage of crosstalk compensation includes a pad capacitor.

9. The communication system of claim 7, wherein said second circuit board further includes a return loss compensation for at least one of said conductive path pairs.

10. The communication system of claim 7, wherein said first circuit board contacts said conductive path pairs at said plug interface contacts and does not contact said output terminals.

11. The communication system of claim 10, wherein said electrical equipment is a patch panel.

12. The communication system of claim 7, wherein said plurality of conductive path pairs includes a first pair corresponding to conductive paths 1 and 2, a second pair corresponding to conductive paths 3 and 6, a third pair corresponding to conductive paths 4 and 5, and a fourth pair corresponding to conductive paths 7 and 8, and wherein said first single stage of crosstalk compensation includes respective compensation capacitors for a first pair combination corresponding to the second pair and the third pair, a second pair combination corresponding to the first pair and the second pair, and a third pair combination corresponding to the second pair and the fourth pair.

13. The communication system of claim 12, wherein said second single stage of crosstalk compensation includes respective compensation capacitors for a fourth pair combination corresponding to the first pair and the third pair, and a fifth pair combination corresponding to the third pair and the fourth pair.

* * * * *